United States Patent
Fan

(10) Patent No.: US 10,818,699 B2
(45) Date of Patent: Oct. 27, 2020

(54) DISPLAY PANEL AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventor: Haoyuan Fan, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/317,840

(22) PCT Filed: May 24, 2018

(86) PCT No.: PCT/CN2018/088257
§ 371 (c)(1),
(2) Date: Jan. 15, 2019

(87) PCT Pub. No.: WO2018/214946
PCT Pub. Date: Nov. 29, 2018

(65) Prior Publication Data
US 2019/0237482 A1    Aug. 1, 2019

(30) Foreign Application Priority Data

May 26, 2017   (CN) .......................... 2017 1 0385962

(51) Int. Cl.
*H01L 27/12* (2006.01)
*G02F 1/1362* (2006.01)

(52) U.S. Cl.
CPC .......... *H01L 27/124* (2013.01); *G02F 1/1362* (2013.01)

(58) Field of Classification Search
CPC ..... G02F 1/1362; H01L 21/77; H01L 27/124; H01L 27/3276
See application file for complete search history.

(56) References Cited

U.S. PATENT DOCUMENTS

| 2005/0212988 A1* | 9/2005 | Nagano ................ G09G 3/3688 349/43 |
| 2008/0099763 A1 | 5/2008 | Tang et al. |

(Continued)

FOREIGN PATENT DOCUMENTS

| CN | 104218056 A | 12/2014 |
| CN | 104681581 A | 6/2015 |

(Continued)

OTHER PUBLICATIONS

PCT, "International Search Report," issued in connection with Application No. PCT/CN2018/088257, dated Sep. 10, 2018, 9 pages.

(Continued)

*Primary Examiner* — Jasmine J Clark
(74) *Attorney, Agent, or Firm* — Arent Fox LLP; Michael Fainberg

(57) ABSTRACT

A display panel and a display device, the display panel comprising: a substrate (1); a signal lead-out wire (2) arranged on the substrate, at least one end of the signal lead-out wire being exposed, the material of the signal lead-out wire comprising a metal, the signal lead-out wire being provided with a disconnected area (A); a heavily doped semiconductor material conductive portion (3) connecting the signal lead-out wire at the disconnected area. The present invention prevents poor display panel displaying caused by corrosion of exposed ends of signal lead-out wires.

14 Claims, 5 Drawing Sheets

(56) References Cited

U.S. PATENT DOCUMENTS

| | | |
|---|---|---|
| 2010/0109993 A1 | 5/2010 | Chang |
| 2014/0353616 A1 | 12/2014 | Park et al. |
| 2015/0144915 A1 | 5/2015 | Lee |
| 2017/0040236 A1 | 2/2017 | Fan et al. |

FOREIGN PATENT DOCUMENTS

| | | |
|---|---|---|
| CN | 104701327 A | 6/2015 |
| CN | 105633097 A | 6/2016 |
| CN | 107221535 A | 9/2017 |

OTHER PUBLICATIONS

SIPO, "First Office Action," issued in connection with Application No. 201710385962.7, dated May 8, 2019, 13 pages.
Chinese Office Action for 201710385962.7 dated Jul. 27, 2020.

\* cited by examiner

DISPLAY PANEL AND DISPLAY DEVICE

CROSS-REFERENCES TO RELATED APPLICATION

The disclosure is a National Stage of International Application No. PCT/CN2018/088257, filed May 24, 2018, which claims priority to Chinese Patent Application No. 201710385962.7, filed with the Chinese Patent Office on May 26, 2017, and entitled with "Display Panel and Display Device", which is hereby incorporated by reference in its entirety.

FIELD

The disclosure relates to the field of display technology, and in particular to a display panel and a display device.

BACKGROUND

In a display panel, one end of a signal lead-out wire may get exposed, namely the end is not sheltered or protected in any forms; the exposed signal lead-out wire can get corroded easily; and corrosion can extend inwards the display panel along the signal lead-out wires, causing abnormal display of the display panel.

SUMMARY

Some embodiments of the disclosure provide a display panel. The display panel includes: a substrate; and a signal lead-out wire which is arranged on the substrate, wherein at least one end of the signal lead-out wire is exposed, a material of the signal lead-out wire includes a metal and the signal lead-out wire has a disconnected area; and a heavily doped semiconductor material conductive portion connected to the signal lead-out wire at the disconnected area.

In a possible implementation, in the display panel according to the embodiment of the disclosure, a material of the heavily doped semiconductor material conduction portion is heavily doped polycrystalline silicon.

In a possible implementation, in the display panel according to the embodiment of the disclosure, the heavily doped semiconductor material conduction portion is arranged at a side of a film layer of the signal lead-out wire away from the substrate.

In a possible implementation, in the display panel according to the embodiment of the disclosure, the heavily doped semiconductor material conduction portion is arranged between a film layer of the signal lead-out wire and the substrate.

In a possible implementation, in the display panel according to the embodiment of the disclosure, the heavily doped semiconductor material conduction portion and the signal lead-out wire re arranged in a same film layer.

In a possible implementation, in the display panel according to the embodiment of the disclosure, the display panel further includes a first insulating layer which is arranged between the heavily doped semiconductor material conduction portion and the signal lead-out wire; and the signal lead-out wire in the disconnected area is connected to the heavily doped semiconductor material conduction portion by first via holes running through the first insulating layer.

In a possible implementation, in the display panel according to the embodiment of the disclosure, the display panel further includes a buffer layer which is arranged between the substrate and the heavily doped semiconductor material conduction portion.

In a possible implementation, in the display panel according to the embodiment of the disclosure, the exposed end of the signal lead-out wire is arranged at a side edge of the substrate.

In a possible implementation, in the display panel according to the embodiment of the disclosure, the exposed end of the signal lead-out wire is arranged at an outermost film layer on the substrate.

In a possible implementation, in the display panel according to the embodiment of the disclosure, the display panel further includes a second insulating layer which is arranged at sides of the signal lead-out wire and the heavily doped semiconductor material conduction portion away from the substrate, and a binding terminal which is arranged at a side of the second insulating layer away from the substrate; and the binding terminal is connected to the signal lead-out wire outside the disconnected area by a second via hole running through the second insulating layer; and the second via hole is away from the exposed end of the signal lead-out wire, relative to the disconnected area.

In a possible implementation, in the display panel according to the embodiment of the disclosure, the display panel further includes a second insulating layer which is arranged at sides of the signal lead-out wire and the heavily doped semiconductor material conduction portion away from the substrate, and a binding terminal which is arranged at a side of the second insulating layer away from the substrate; and the binding terminal is connected to the heavily doped semiconductor material conduction portion by a second via hole running through the second insulating layer.

In a possible implementation, in the display panel according to the embodiment of the disclosure, the unexposed part of the signal lead-out wire is connected to a signal line.

In a possible implementation, in the display panel according to the embodiment of the disclosure, the heavily doped semiconductor material conduction portion is connected to a signal line.

In another aspect, some embodiments of the disclosure further provide a display device. The display device includes the display panel according to the above embodiments.

DETAILED DESCRIPTION

Figure 1:
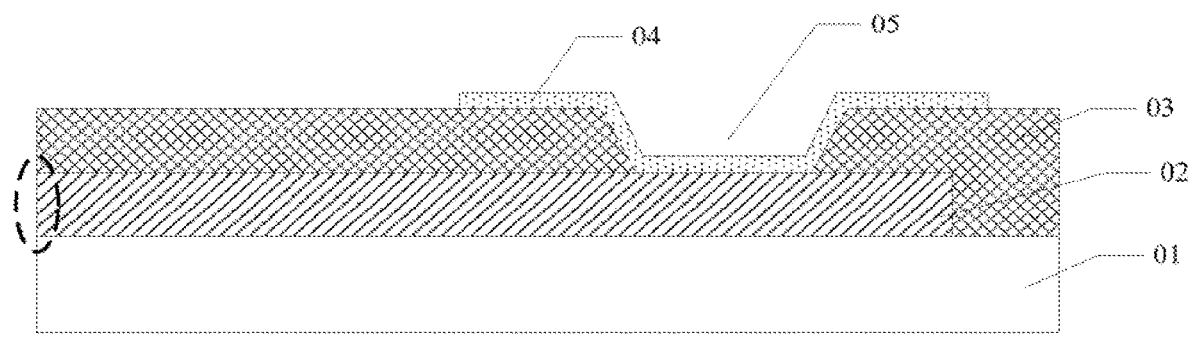
FIG. 1 is a schematic diagram of the display panel before corrosion in related art.
Figure 2:
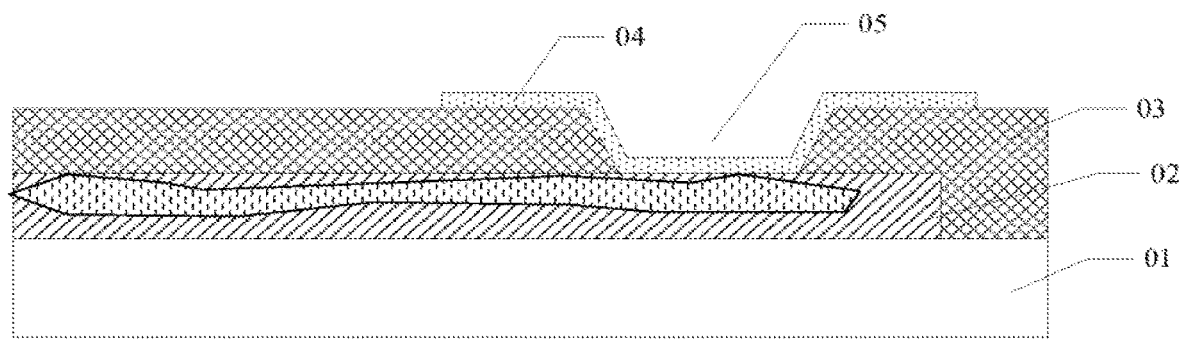
FIG. 2 is a schematic diagram of the display panel after corrosion in related art.

During the production process of the display panel, a test circuit is generally arranged to be connected to the display panel circuit, so as to detect the display panel. After the display panel is tested, the test circuit is cut off, and the end of a residual part of a signal lead-out wire, which is connected to the test circuit, is exposed on a fracture surface; the exposed signal lead-out wire can get corroded easily, and corrosion can extend inwards along the signal lead-out wire until to a binding area, even to a display area, thus causing transmission interruption of operating signals of the display panel, and subsequent display abnormity of the display panel. For example, as shown in FIG. 1, after the test circuit is cut off, the display panel includes a substrate 01 and a signal lead-out wire 02 which is arranged on the substrate 01, wherein one end of the signal lead-out wire 02 is exposed (as shown in a dashed box in the FIG. 1); an insulating layer 03 is arranged on the signal lead-out wire 02; a binding terminal 04 is arranged on the insulating layer 03; the binding terminal 04 is connected to the signal lead-out wire 02 by a via hole 05 running through the insulating layer 03. FIG. 2 shows the schematic diagram of the signal lead-out wire 02 after corrosion.

Figure 3:
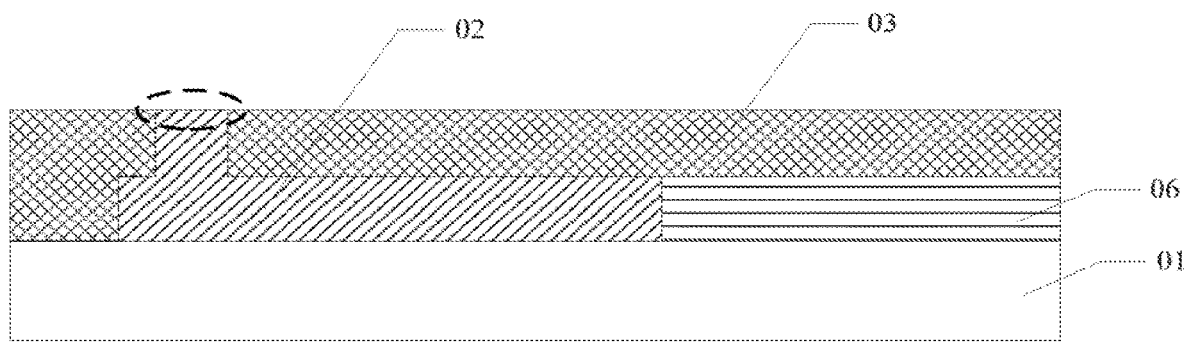
FIG. 3 is a schematic diagram of the display panel before corrosion in related art.

Furthermore, in some embodiments, the display panel is provided with a signal lead-out wire which is connected to a signal line of the display panel, and the end of the signal lead-out wire is exposed and can get corroded easily, thus causing transmission interruption of the operating signals of the display panel, and subsequent display abnormity of the display panel. For example, as shown in FIG. 3, the display panel includes a substrate 01 and a signal lead-out wire 02 which is arranged on the substrate 01, wherein one end of the signal lead-out wire 02 is exposed (as shown in a dashed box in the FIG. 3); an insulating layer 03 is arranged on the signal lead-out wire 02; the signal lead-out wire 02 is connected to a signal line 06; and the signal lead-out wire 02 is arranged in a same layer with the signal line 06.

In view of this, the present disclosure provides a display panel and a display device, in order to prevent poor display of the display panel caused by corrosion of the exposed end of the signal lead-out wire.

Herein, the technical solutions of the disclosure will be described below clearly and fully with reference to the drawings in the embodiments of this disclosure. Apparently the embodiments described below are only a part but not all of the embodiments of this disclosure. Based upon the embodiments here of this disclosure, all the other embodiments which can occur to those ordinarily skilled in the art without any inventive effort shall fall into the scope of this disclosure.

It should be noted that the thicknesses and shapes of various layers as shown in the drawings of the present disclosure are not intended to reflect real proportions, but only intended to illustrate the contents of the present disclosure.

As shown in FIG. 4 to FIG. 9, the display panel according to the embodiments includes a substrate 1, a signal lead-out wire 2 which is arranged on the substrate 1, where at least one end of the signal lead-out signal 2 is exposed (as shown in dashed boxes in the drawings), and the material of the signal lead-out wire 2 includes metal and the signal lead-out wire 2 has a disconnected area A, and a heavily doped semiconductor material conductive portion 3, wherein the heavily doped semiconductor material conductive portion 3 is connected to the signal lead-out wire 2 at the disconnected area A.

Specifically, the material of the signal lead-out wire 2 includes metal, may be alloy or a laminated structure of multiple layers of metal and the like. The metal, when exposed to the environment containing air, water vapor and the like, can get corroded easily while a semiconductor material cannot get corroded easily, i.e., the semiconductor material has an excellent insulating effect on corrosion and the heavily doped semiconductor material is excellent in conductivity. Therefore, in the embodiments of the disclosure, the signal lead-out wire 2 has the disconnected area A, and the heavily doped semiconductor material conductive portion 3 is connected to the signal lead-out wire 2 at the disconnected area A, so that corrosion can be effectively prevented from extending towards other parts of the signal lead-out wire 2 under a circumstance that the signal lead-out wire 2 is conductive in the disconnected area A; therefore, the exposed end of the signal lead-out wire 2 can be prevented from getting corroded, and subsequent poor display of the display panel can be avoided.

Optionally, in the display panel according to the embodiments of the disclosure, the material of the heavily doped semiconductor material conductive portion 3 is heavily doped polycrystalline silicon, but also can be other semiconductor materials, such as amorphous silicon and the like, and the material is not limited here. Specifically, the heavily doped polycrystalline silicon is the polycrystalline silicon heavily doped with phosphorous ions or boron ions for example.

In the production process, the heavily doped polycrystalline silicon is formed by the following steps.

An amorphous silicon film layer is formed.

The amorphous silicon film layer is crystallized by an excimer laser annealing process, to convert the amorphous silicon film layer into a polycrystalline silicon film layer.

The polycrystalline silicon film layer is heavily doped by an ion injection process, to form a heavily doped polycrystalline silicon film layer.

The heavily doped polycrystalline silicon film layer is patterned to form the heavily doped polycrystalline silicon.

Specifically, in the display panel according to the embodiments of the disclosure, there may be various positional relationships between the heavily doped semiconductor material conductive portion 3 and the signal lead-out wire 2, and herein are some examples.

Figure 5:
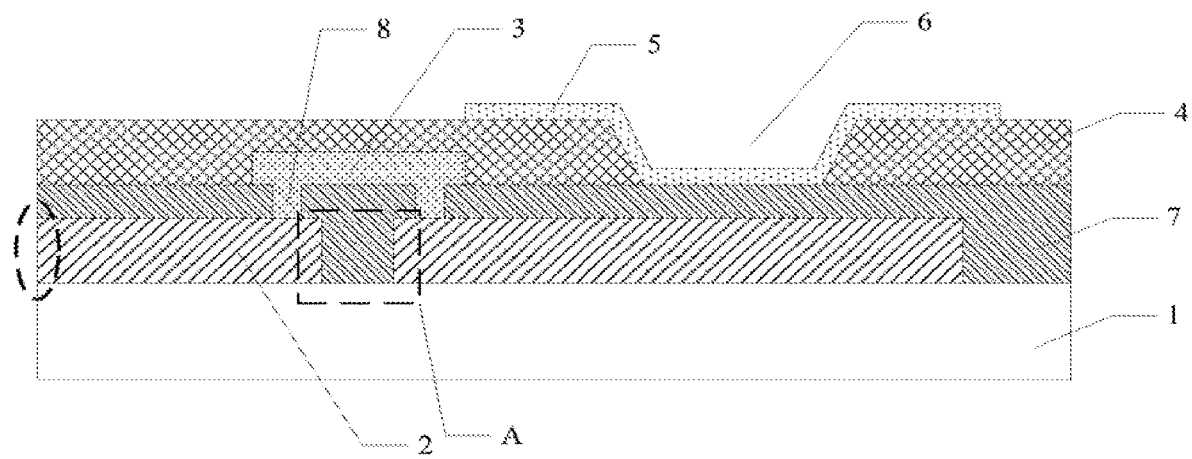
FIG. 5 is a schematic diagram of the display panel according to some embodiments of the disclosure.
Figure 8:
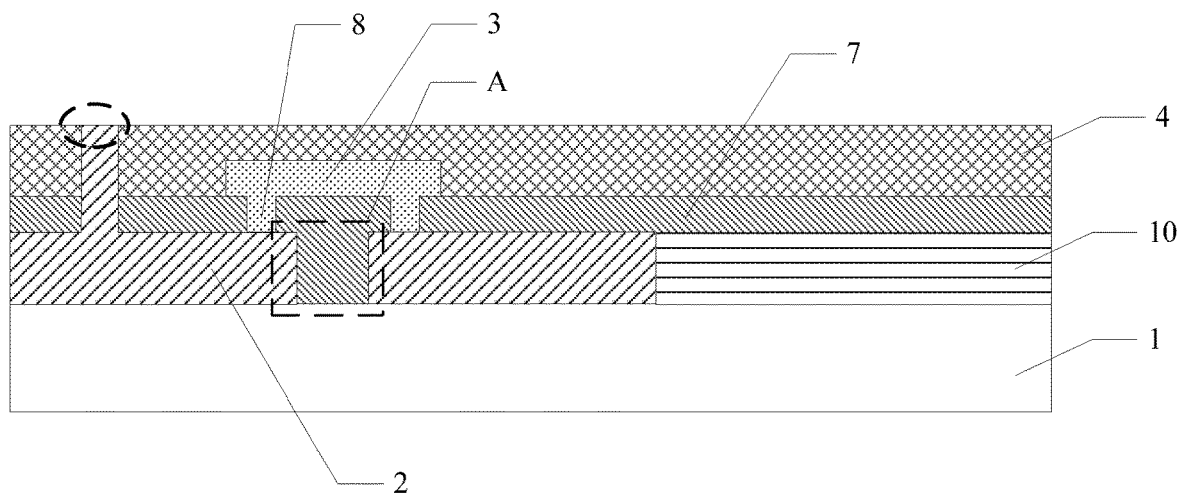
FIG. 8 is a schematic diagram of the display panel according to some embodiments of the disclosure.

Optionally, in the display panel according to the embodiments of the disclosure, as shown in FIG. 5 and FIG. 8, the heavily doped semiconductor material conductive portion 3 can be arranged at the side of the film layer of the signal lead-out wire 2 away from the substrate 1.

Specifically, the signal lead-out wire 2 is formed on the substrate 1 firstly, and then the heavily doped semiconductor material conductive portion 3 is formed, so that the heavily doped semiconductor material conductive portion 3 can be prevented from being contaminated by impurities in the substrate 1, and good conductivity of the heavily doped semiconductor material conductive portion 3 can be guaranteed.

Figure 4:
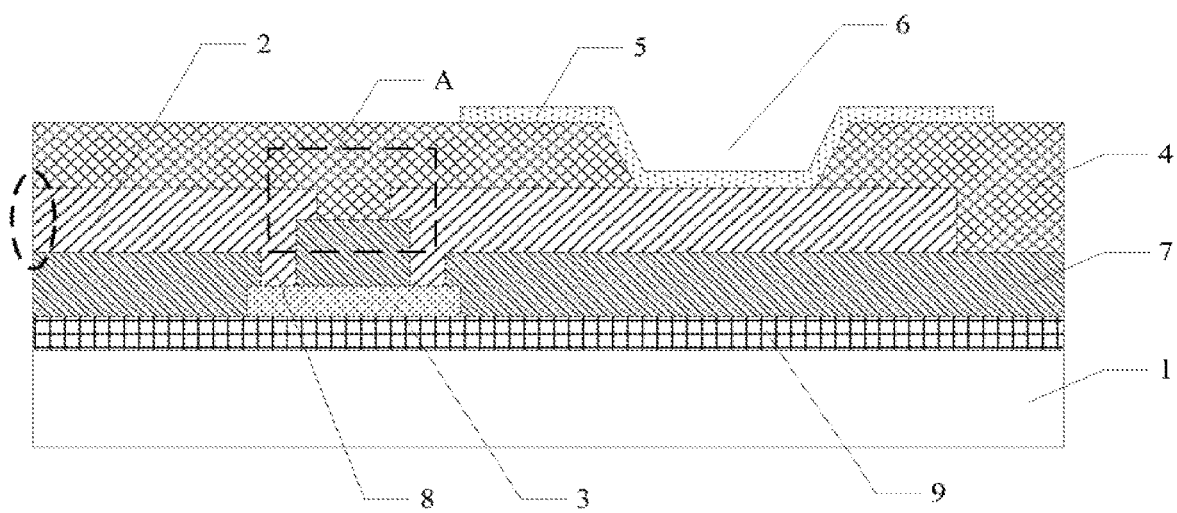
FIG. 4 is a schematic diagram of the display panel according to some embodiments of the disclosure.
Figure 7:
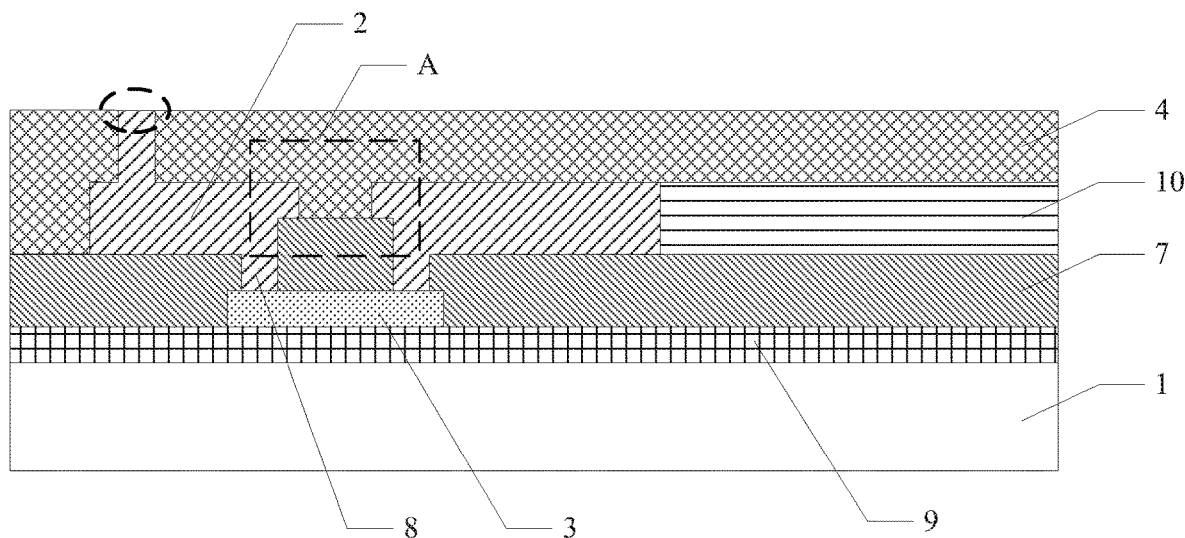
FIG. 7 is a schematic diagram of the display panel according to some embodiments of the disclosure.

Optionally, in the display panel according to the embodiments of the disclosure, as shown in FIG. 4 and FIG. 7, the heavily doped semiconductor material conductive portion 3 can be arranged between the film layer, where the signal lead-out wire 2 is located, and the substrate 1.

Figure 6:
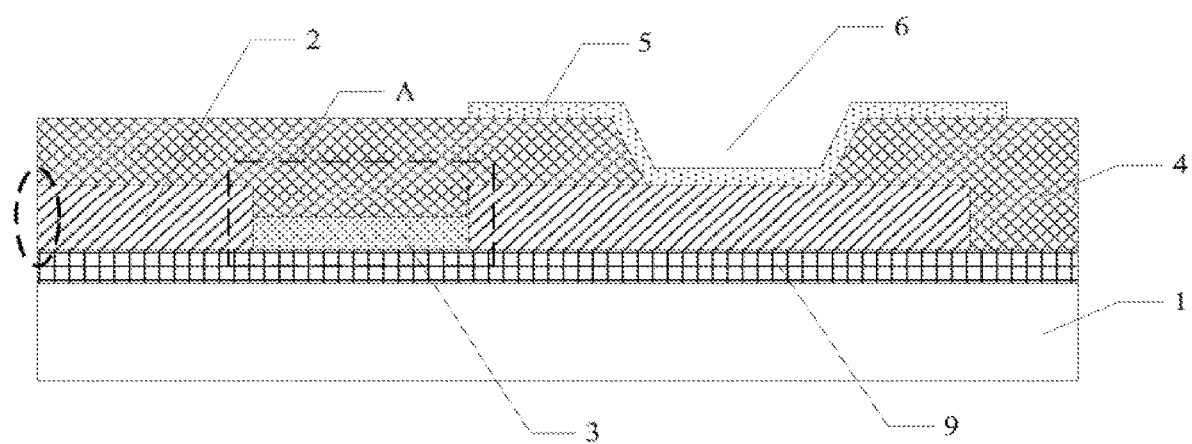
FIG. 6 is a schematic diagram of the display panel according to some embodiments of the disclosure.
Figure 9:
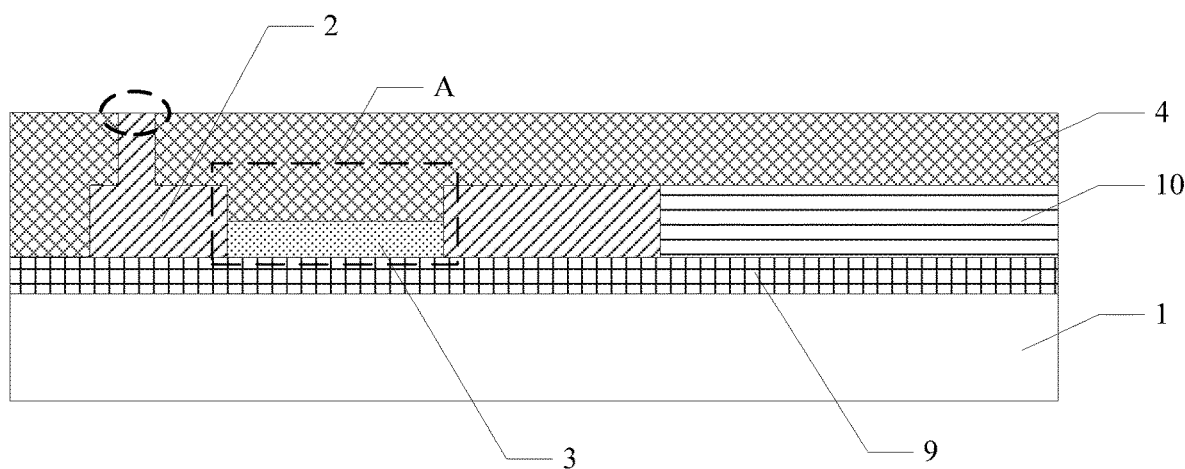
FIG. 9 is a schematic diagram of the display panel according to some embodiments of the disclosure.

Optionally, in the display panel according to the embodiments of the disclosure, as shown in FIG. 6 and FIG. 9, the heavily doped semiconductor material conductive portion 3 can be arranged on a same film layer as the signal lead-out wire 2.

Specifically, the heavily doped semiconductor material conductive portion 3 can be arranged on the location of the disconnected area A of the signal lead-out wire 2 and is connected to two ends of the disconnected area of the signal lead-out wire 2.

Optionally, in the display panel according to the embodiments of the disclosure, as shown in FIG. 4, FIG. 5, FIG. 7 and FIG. 8, when the heavily doped semiconductor material conductive portion 3 and the signal lead-out wire 2 are arranged in different layers, the display panel can further include a first insulating layer 7 which is arranged between the heavily doped semiconductor material conductive portion 3 and the signal lead-out wire 2.

The signal lead-out wire 2 is connected to the heavily doped semiconductor material conductive portion 8 at the disconnected area A through first via holes 8 running through the first insulating layer 7.

Specifically, the first insulating layer 7 is arranged between the heavily doped semiconductor material conductive portion 3 and the signal lead-out wire 2; therefore, on one hand, the heavily doped semiconductor material conductive portion 3 and the signal lead-out wire 2, when manufactured, are prevented from getting mutually affected, and on the other hand, the heavily doped semiconductor material conductive portion 3 and the signal lead-out wire 2 can be manufactured simultaneously with a film layer pattern of a display area of the display panel, for example, the signal lead-out wire 2 can be manufactured simultaneously with gate metal or data line metal of the display area, and the heavily doped semiconductor material conductive portion 3 can be manufactured simultaneously with an active layer of the display area, so that a manufacturing process can be simplified.

Optionally, in the display panel according to the embodiments of the disclosure, as shown in FIG. 4, FIG. 6, FIG. 7 and FIG. 9, when there is no film layer, such as the signal lead-out wire 2 between the heavily doped semiconductor material conductive portion 3 and the substrate 1, i.e., the heavily doped semiconductor material conductive portion 3 and the signal lead-out wire 2 are arranged in a same film layer, or the heavily doped semiconductor material conductive portion 3 is arranged between the film layer of the signal lead-out wire 2 and the substrate 1, the display panel can further include a buffer layer 9 which is arranged between the substrate 1 and the heavily doped semiconductor material conductive portion 3.

Specifically, the heavily doped semiconductor material conductive portion 3 can be prevented from getting contaminated by impurities in the substrate 1 by virtue of the buffer layer 9, so that excellent conductivity of the heavily doped semiconductor material conductive portion 3 can be guaranteed.

Optionally, in the display panel according to the embodiments of the disclosure, as shown in FIG. 4, FIG. 5 and FIG. 6, the exposed end of the signal lead-out wire 2 can be arranged on the side edge of the substrate 1. Under normal circumstances, the test circuit needs to be cut off after the display panel is tested, and the end of the residual part of the signal lead-out wire 2, which is connected to the test circuit, can get exposed on the fracture surface, i.e., the exposed end of the signal lead-out wire 2 is arranged on the side edge of the substrate 1.

Optionally, in the display panel according to the embodiments of the disclosure, as shown in FIG. 7, FIG. 8 and FIG. 9, the exposed end of the signal lead-out wire 2 can be arranged on the outermost film layer on the substrate 1.

Optionally, in the display panel according to the embodiments of the disclosure, as shown in FIG. 4, FIG. 5 and FIG. 6, the display panel can further include a second insulating layer 4 which is arranged at the sides of the signal lead-out wire 2 and the heavily doped semiconductor material conductive portion 3 away from the substrate 1, and a binding terminal 5 which is arranged at the side of the second insulating layer 4 away from the substrate 1.

The binding terminal 5 is connected to the signal lead-out wire 2 outside the disconnected area A through a second via hole 6 running through the second insulating layer 4; and the second via hole 6 is away from the exposed end of the signal lead-out wire 3 relative to the disconnected area A.

Specifically, the second insulating layer 4 can be planarized. In addition, the binding terminal 5, for example, can be configured for connecting a flexible printed circuit (FPC) or IC, which is not limited here.

Or, optionally, the display panel according to the embodiments of the disclosure can further include a second insulating layer 4 which is arranged at the sides, away from the substrate 1, of the signal lead-out wire 2 and the heavily doped semiconductor material conductive portion 3, and a binding terminal 5 which is arranged at the side, away from the substrate 1, of the second insulating layer 4.

The binding terminal 5 is connected to the heavily doped semiconductor material conductive portion 3 through the second via hole 6 running through the second insulating layer 4; therefore, the binding terminal 5 can be electrically connected with the signal lead-out wire 2 through the heavily doped semiconductor material conductive portion 3, so as to transmit an electric signal to the signal lead-out wire 2.

Optionally, in the display panel according to the embodiments of the disclosure, as shown in FIG. 7, FIG. 8 and FIG. 9, the unexposed part of the signal lead-out wire 2 can be connected to a signal line 10, so as to provide an electric signal to the signal line 10 through the signal lead-out wire 2.

Specifically, the signal line 10 can be arranged in a same layer with the signal lead-out wire 2, or the signal line 10 can be arranged in different layers with the signal lead-out wire 2. For example, an insulating layer is arranged between the signal line 10 and the signal lead-out wire 2, and the signal lead-out wire 2 is connected to the signal line 10 through a via hole running through the insulating layer, which is not limited here. Specifically, the signal line 10 can be a gate line, a data line and the like.

Or, optionally, in the display panel according to the embodiments of the disclosure, the heavily doped semiconductor material conductive portion 3 can be also connected to the signal line 10; therefore, the signal lead-out wire 3 can be connected to the signal line 10 through the heavily doped semiconductor material conductive portion 3, so as to transmit an electric signal to the signal line 10.

On the basis of a same inventive concept, the embodiments of the present disclosure also provide a display device. The display device includes the above display panel according to any embodiment of the present disclosure. The display device can be a mobile phone, a tablet PC, a television, a display, a notebook computer, a digital picture frame, a navigating instrument or other any products or components having a display function.

In conclusion, in the technical scheme according to the embodiments, the display panel includes the substrate, the signal lead-out wire which is arranged on the substrate, where at least one end of the signal lead-out wire is exposed, the material of the signal lead-out wire includes metal and the signal lead-out wire has the disconnected area, and the heavily doped semiconductor material conductive portion which is connected to the signal lead-out wire at the disconnected area. The heavily doped semiconductor material conductive portion is excellent in conductivity, so that two ends of the signal lead-out wire at the disconnected area can conduct; meanwhile, the heavily doped semiconductor material conductive portion, which is the semiconductor material, is excellent in insulating effect on corrosion, so that corrosion can be prevented from extending inwards the signal lead-out wire, and transmission interruption of operating signals of the display panel cannot be caused by the corrosion; therefore, poor display of the display panel, which is caused by the case that the exposed end of the signal lead-out wire is corroded, is prevented.

Evidently those skilled in the art can make various modifications and variations to the disclosure without departing from the spirit and scope of this disclosure. Thus the disclosure is also intended to encompass these modifications and variations thereto so long as the modifications and variations come into the scope of the claims appended to the disclosure and their equivalents.

The invention claimed is:

1. A display panel, comprising:
   a substrate;
   a signal lead-out wire arranged on the substrate, wherein the signal lead-out wire comprises a first portion and a second portion disconnected from each other, and a material of the first portion and the second portion comprises a metal, at least one of the first portion and the second portion has an exposed end; and
   a heavily doped semiconductor material conduction portion electrically connected to the first portion and the second portion.

2. The display panel according to claim 1, wherein a material of the heavily doped semiconductor material conduction portion is heavily doped polycrystalline silicon.

3. The display panel according to claim 1, wherein the first portion and the second portion are in a same film layer, the heavily doped semiconductor material conduction portion is arranged at a side of the film layer of the first portion and the second portion away from the substrate.

4. The display panel according to claim 1, wherein the first portion and the second portion are in a same film layer, the heavily doped semiconductor material conduction portion is arranged between the substrate and the film layer of the first portion and the second portion.

5. The display panel according to claim 1, wherein the heavily doped semiconductor material conduction portion, the first portion and the second portion are arranged in a same film layer.

6. The display panel according to claim 3, further comprising a first insulating layer which is arranged between the heavily doped semiconductor material conduction portion and the film layer of the first portion and the second portion, and first via holes penetrating through the first insulating layer; and the first portion and the second portion are electrically connected to the heavily doped semiconductor material conduction portion through the first via holes.

7. The display panel according to claim 4, further comprising a buffer layer which is arranged between the substrate and the heavily doped semiconductor material conduction portion.

8. The display panel according to claim 1, wherein the exposed end of the signal lead-out wire is arranged at a side edge of the substrate.

9. The display panel according to claim 1, wherein the exposed end of the signal lead-out wire is arranged in an outermost film layer on the substrate.

10. The display panel according to claim 1, further comprising a second insulating layer which is arranged at sides, away from the substrate, of the signal lead-out wire and the heavily doped semiconductor material conduction portion, and a binding terminal which is arranged at a side of the second insulating layer away from the substrate; and the binding terminal is connected to the first portion or the second portion through a second via hole penetrating through the second insulating layer; and a distance between the second via hole and the exposed end of the signal lead-out wire is larger than a distance between the heavily doped semiconductor material conduction portion and the exposed end of the signal lead-out wire.

11. The display panel according to claim 1, further comprising a second insulating layer which is arranged at sides, away from the substrate, of the signal lead-out wire and the heavily doped semiconductor material conduction portion, and a binding terminal which is arranged at a side of the second insulating layer away from the substrate; and the binding terminal is connected to the heavily doped semiconductor material conduction portion through a second via hole running through the second insulating layer.

12. The display panel according to claim 1, wherein the unexposed part of the signal lead-out wire is connected to a signal line.

13. The display panel according to claim 1, wherein the heavily doped semiconductor material conduction portion is connected to a signal line.

14. A display device, comprising the display panel according to claim 1.

* * * * *